US009818362B2

(12) United States Patent
Cao

(10) Patent No.: US 9,818,362 B2
(45) Date of Patent: *Nov. 14, 2017

(54) CHARGING SCAN AND CHARGE SHARING SCAN DOUBLE OUTPUT GOA CIRCUIT

(71) Applicant: Shenzhen China Star Optoelectronics Technology Co., Ltd., Shenzhen, Guangdong (CN)

(72) Inventor: Shangcao Cao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 15 days.

This patent is subject to a terminal disclaimer.

(21) Appl. No.: 15/589,953

(22) Filed: May 8, 2017

(65) Prior Publication Data

US 2017/0243555 A1    Aug. 24, 2017

Related U.S. Application Data

(62) Division of application No. 14/428,978, filed on Mar. 18, 2015.

(30) Foreign Application Priority Data

Nov. 25, 2014   (CN) .......................... 2014 1 0692722

(51) Int. Cl.
G06F 3/038     (2013.01)
G09G 5/00      (2006.01)
G09G 3/36      (2006.01)

(52) U.S. Cl.
CPC ... *G09G 3/3677* (2013.01); *G09G 2310/0205* (2013.01); *G09G 2310/0251* (2013.01); *G09G 2320/028* (2013.01)

(58) Field of Classification Search
CPC ... G09G 2310/0205; G09G 2310/0251; G09G 2310/0286; G09G 2310/067;
(Continued)

(56) References Cited

U.S. PATENT DOCUMENTS

2012/0153996 A1* 6/2012 Su ........................ G09G 3/3659
327/109
2013/0009856 A1* 1/2013 Takahashi ............ G11C 19/184
345/92

* cited by examiner

*Primary Examiner* — Insa Sadio
(74) *Attorney, Agent, or Firm* — Andrew C. Cheng

(57) ABSTRACT

Provided is a charging scan and charge sharing scan double output GOA circuit to combine the time sequence and circuit. The nth stage GOA unit circuit receives the first, the second low frequency clock signals (LC1, LC2), the direct current low voltage signal (Vss), the Mth, M−2th high frequency clock signals (CK(M), CK(M−2)), a stage transfer signal (ST(n−2)) generated by the n−2th stage GOA unit circuit, a charging scan signal (CG(n−2)) generated by the n−2th stage GOA unit circuit and a stage transfer signal (ST(n+2)) generated by the n+2th stage GOA unit circuit, the charging scan signal (CG(n)), a charge sharing scan signal (SG(n−2)) generated by the n−2th stage GOA unit circuit and the stage transfer signal (ST(n)) are respectively outputted with different TFTs; the nth stage GOA unit circuit comprises a transmission module (100), a transfer regulation module (200), an output module (300), a rapid pull-down module (400) and a pull-down holding module (500).

10 Claims, 7 Drawing Sheets

(58) Field of Classification Search
CPC ..... G09G 2320/0242; G09G 2320/028; G09G 3/3677; G11C 19/287
See application file for complete search history.

CHARGING SCAN AND CHARGE SHARING SCAN DOUBLE OUTPUT GOA CIRCUIT

CROSS REFERENCE TO RELATED APPLICATIONS

This is a divisional application of co-pending U.S. patent application Ser. No. 14/428,978, filed on Mar. 18, 2015, which is a national stage of PCT Application Number PCT/CN2015/072504, filed on Feb. 9, 2015, claiming foreign priority of Chinese Patent Application Number 201410692722.8, filed on Nov. 25, 2014.

FIELD OF THE INVENTION

The present invention relates to a display technology field, and more particularly to a charging scan and charge sharing scan double output GOA circuit.

BACKGROUND OF THE INVENTION

The LCD (Liquid Crystal Display) possesses advantages of thin body, power saving and no radiation to be widely used in many application scope, such as LCD TV, mobile phone, personal digital assistant (PDA), digital camera, notebook, laptop, and dominates the flat panel display field.

Most of the liquid crystal displays on the present market are backlight type liquid crystal displays, which comprise a liquid crystal display panel and a backlight module. The working principle of the liquid crystal display panel is that the Liquid Crystal is injected between the Thin Film Transistor Array Substrate (TFT array substrate) and the Color Filter (CF). The light of backlight module is refracted to generate images by applying driving voltages to the two substrates for controlling the rotations of the liquid crystal molecules.

In the active liquid crystal display, each pixel is electrically coupled to a thin film transistor (TFT), and the gate thereof is coupled to a level scan line, and the drain is coupled to a vertical data line, and the source is coupled to the pixel electrode. The enough voltage is applied to the level scan line, and all the TFTs electrically coupled to the scan line are activated. Thus, the signal voltage on the data line can be written into the pixel to control the transmittances of different liquid crystals to achieve the effect of controlling colors. The driving of the level scan line in the present active liquid crystal display is mainly accomplished by the external Integrated Circuit (IC). The external IC can control the charge and discharge stage by stage of the level scan lines of respective stages. The GOA technology, i.e. the Gate Driver on Array technology can utilize the original manufacture processes of the liquid crystal display panel to manufacture the driving circuit of the level scan lines on the substrate around the active area, to replace the external IC for accomplishing the driving of the level scan lines. The GOA technology can reduce the bonding procedure of the external IC and has potential to raise the productivity and lower the production cost. Meanwhile, it can make the liquid crystal display panel more suitable to the narrow frame or non frame design of display products.

In present large scale LCDs, the color washout phenomenon under wide view angle happens and the situation particularly becomes more obvious in the Vertical Alignment (VA) type LCDs. For improving the color washout under wide view angle of the large scale VA type liquid crystal display, the Charge Share pixel design is utilized in prior art to reduce the color washout. The GOA circuit of each stage outputs the charging scan signal and the charge sharing scan signal (Charge & Share gate) via a sequence signal line at the same time, which not only increases the loading of the scan line and the sequence signal line but also degrades the output quality of the scan signal, and meanwhile the stress of the IC is increased. On the other hand, the charging scan signal and the charge sharing scan signal are outputted by the same TFT. The waveforms of the two are consistent, which is not good to the reasonable design of the TFT specification.

SUMMARY OF THE INVENTION

An objective of the present invention is to provide a charging scan and charge sharing scan double output GOA circuit, which can realize that the charging scan signal and the charge sharing scan are respectively outputted by two different high frequency clock signals via one TFT at the same time, and the output waveforms of the charging scan signal and the charge sharing scan signal are controlled by the corresponding specifications of the TFTs. The IC instant current can be diminished to lower the loading of the IC and to raise the flexibility of the color shift design.

For realizing the aforesaid objective, the present invention provides a charging scan and charge sharing scan double output GOA circuit, comprising a plurality of GOA unit circuits which are cascade connected, and a first, a second low frequency clock signals, a direct current low voltage signal and four metal lines of high frequency clock signals located at periphery of the GOA unit circuits of respective stages; N is set to be a positive integer and the nth stage GOA unit circuit receives the first, the second low frequency clock signals, the direct current low voltage signal, Mth, M−2th high frequency clock signals, a stage transfer signal generated by the n−2th stage GOA unit circuit, a charging scan signal generated by the n−2th stage GOA unit circuit and a stage transfer signal generated by the n+2th stage GOA unit circuit, the charging scan signal, a charge sharing scan signal generated by the n−2th stage GOA unit circuit and the stage transfer signal are respectively outputted with different TFTs;

the nth stage GOA unit circuit comprises a transmission module, a transfer regulation module, an output module, a rapid pull-down module and a pull-down holding module.

The output module comprises a twentieth transistor, and a gate of the twentieth transistor is coupled to a first node, and a source is coupled to the M−2th high frequency clock signal, and a drain is coupled to the charge sharing scan signal of the n−2th stage GOA unit circuit; the twentieth transistor is employed to output the charge sharing scan signal of the n−2th stage GOA unit circuit according to the M−2th high frequency clock signal as the first node is at high voltage level.

a twenty-first transistor, and a gate of the twenty-first transistor is electrically coupled to the first node, and a source is electrically coupled to the Mth high frequency clock signal, and a drain outputs the charging scan signal; the twenty-first transistor is employed to output the charging scan signal according to the Mth high frequency clock signal as the twenty-first transistor is at high voltage level;

a twenty-second transistor, and a gate of the twenty-second transistor is electrically coupled to the first node, and a source is electrically coupled to the Mth high frequency clock signal, and a drain outputs the stage transfer signal; the twenty-second transistor is employed to output the stage transfer signal according to the Mth high frequency clock signal as the twenty-second transistor is at high voltage level.

The output module comprises a capacitor, and one end of the capacitor is electrically coupled to the first node, and the other end is electrically coupled to the charging scan signal.

The transmission module comprises an eleventh transistor, and a gate of the eleventh transistor is electrically coupled to the stage transfer signal of the n−2th stage GOA unit circuit, and a source is electrically coupled to the charging scan signal of the n−2th stage GOA unit circuit, and a drain is electrically coupled to the first node;

the pull-down holding module comprises a fifty-fifth transistor, a first pull-down holding module and a second pull-down holding module;

a gate of the fifty-fifth transistor is electrically coupled to the first node, and a source is electrically coupled to a second node, and a drain is electrically coupled to a third node;

the first pull-down holding module comprises a forty-second transistor, and a gate of the forty-second transistor is electrically coupled to the second node, and a source is electrically coupled to the first node, and a drain is electrically coupled to the direct current low voltage signal; a fifty-first transistor, and both a gate and a source of the fifty-first transistor are electrically coupled to the first low frequency clock signal, and a drain is electrically coupled to a gate of a fifty-third transistor; the fifty-third transistor, and the gate of the fifty-third transistor is electrically coupled to the drain of the fifty-first transistor, and a source is electrically coupled to the first low frequency clock signal, and a drain is electrically coupled to the second node; a fifty-fourth transistor, and a gate of the fifty-fourth transistor is electrically coupled to the second low frequency clock signal, and a source is electrically coupled to the first low frequency clock signal, and a drain is electrically coupled to the second node; a thirty-second transistor, and a gate of the thirty-second transistor is electrically coupled to the second node, and a source is electrically coupled to the charging scan signal, and a drain is electrically coupled to the direct current low voltage signal;

the second pull-down holding module comprises a forty-third transistor, and a gate of the forty-third transistor is electrically coupled to the third node, and a source is electrically coupled to the first node, and a drain is electrically coupled to the direct current low voltage signal; a sixty-first transistor, and both a gate and a source of the sixty-first transistor are electrically coupled to the second low frequency clock signal, and a drain is electrically coupled to a gate of a sixty-third transistor; the sixty-third transistor, and the gate of the sixty-third transistor is electrically coupled to the drain of the sixty-first transistor, and a source is electrically coupled to the second low frequency clock signal, and a drain is electrically coupled to the third node; a sixty-fourth transistor, and a gate of the sixty-fourth transistor is electrically coupled to the first low frequency clock signal, and a source is electrically coupled to the second low frequency clock signal, and a drain is electrically coupled to the third node; a thirty-third transistor, and a gate of the thirty-third transistor is electrically coupled to the third node, and a source is electrically coupled to the charging scan signal, and a drain is electrically coupled to the direct current low voltage signal;

the transfer regulation module comprises a fifty-second transistor, and a gate of the fifty-second transistor is electrically coupled to the first node, and a source is electrically coupled to the second node, and a drain is electrically coupled to the direct current low voltage signal; a sixty-second transistor, and a gate of the sixty-second transistor is electrically coupled to the first node, and a source is electrically coupled to the third node, and a drain is electrically coupled to the direct current low voltage signal; a fifty-sixth transistor, and a gate of the fifty-sixth transistor is electrically coupled to the stage transfer signal of the n−2th stage GOA unit circuit, and a source is electrically coupled to the drain of the fifty-first transistor, and a drain is electrically coupled to the direct current low voltage signal; a sixty-sixth transistor, and a gate of the sixty-sixth transistor is electrically coupled to the stage transfer signal of the n−2th stage GOA unit circuit, and a source is electrically coupled to the drain of the sixty-first transistor, and a drain is electrically coupled to the direct current low voltage signal;

the rapid pull-down module comprises a thirtieth transistor, and a gate of the thirtieth transistor is electrically coupled to the stage transfer signal of the n+2th stage GOA unit circuit, and a source is electrically coupled to the charge sharing scan signal of the n−2th stage GOA unit circuit, and a drain is electrically coupled to the direct current low voltage signal; a thirty-first transistor, and a gate of the thirty-first transistor is electrically coupled to the stage transfer signal of the n+2th stage GOA unit circuit, and a source is electrically coupled to the charging scan signal, and a drain is electrically coupled to the direct current low voltage signal; a forty-first transistor, and a gate of the forty-first transistor is electrically coupled to the stage transfer signal of the n+2th stage GOA unit circuit, and a source is electrically coupled to the first node, and a drain is electrically coupled to the direct current low voltage signal.

In a first and a second stage connections of the charging scan and charge sharing scan double output GOA circuit, both the gate and the source of the eleventh transistor are electrically coupled to a start signal of the circuit, and merely the drain of the twenty-first transistor normally outputs and the drain of the twentieth transistor outputs a low voltage level.

In a last and a last but one stage connections of the charging scan and charge sharing scan double output GOA circuit, all the gate of the thirtieth transistor, the gate of the thirty-first transistor and the gate of the forty-first transistor are electrically coupled to a start signal of the circuit.

An output waveform of the charging scan signal is controlled by a specification of the twenty-first transistor; an output waveform of the charge sharing scan signal of the n−2th stage GOA unit circuit is controlled by a specification of the twentieth transistor.

All the four high frequency clock signals are divided into a charging scan output part and a charge sharing scan output part in one period; a time width that the charging scan output part of the Mth high frequency clock signal is at high voltage level is larger than a time width that the charge sharing scan output part of the M−2th high frequency clock signal is at high voltage level.

As the Mth high frequency clock signal is the first high frequency clock signal, the M−2th high frequency clock signal is the third high frequency clock signal; as the Mth high frequency clock signal is the second high frequency clock signal, the M−2th high frequency clock signal is the fourth high frequency clock signal.

Voltage levels of the first, the second frequency clock signals are reversed every other frame or multiple frames.

The present invention further provides a charging scan and charge sharing scan double output GOA circuit, comprising a plurality of GOA unit circuits which are cascade connected, and a first, a second low frequency clock signals, a direct current low voltage signal and four metal lines of high frequency clock signals located at periphery of the GOA unit circuits of respective stages; N is set to be a positive integer and the nth stage GOA unit circuit receives the first, the second low frequency clock signals, the direct current low voltage signal, Mth, M−2th high frequency clock signals, a stage transfer signal generated by the n−2th stage GOA unit circuit, a charging scan signal generated by the n−2th stage GOA unit circuit and a stage transfer signal generated by the n+2th stage GOA unit circuit, the charging scan signal, a charge sharing scan signal generated by the n−2th stage GOA unit circuit and the stage transfer signal are respectively outputted with different TFTs;

the nth stage GOA unit circuit comprises a transmission module, a transfer regulation module, an output module, a rapid pull-down module and a pull-down holding module;

wherein the output module comprises a twentieth transistor, and a gate of the twentieth transistor is coupled to a first node, and a source is coupled to the M−2th high frequency clock signal, and a drain is coupled to the charge sharing scan signal of the n−2th stage GOA unit circuit; the twentieth transistor is employed to output the charge sharing scan signal of the n−2th stage GOA unit circuit according to the M−2th high frequency clock signal as the first node is at high voltage level;

a twenty-first transistor, and a gate of the twenty-first transistor is electrically coupled to the first node, and a source is electrically coupled to the Mth high frequency clock signal, and a drain outputs the charging scan signal; the twenty-first transistor is employed to output the charging scan signal according to the Mth high frequency clock signal as the twenty-first transistor is at high voltage level;

a twenty-second transistor, and a gate of the twenty-second transistor is electrically coupled to the first node, and a source is electrically coupled to the Mth high frequency clock signal, and a drain outputs the stage transfer signal; the twenty-second transistor is employed to output the stage transfer signal according to the Mth high frequency clock signal as the twenty-second transistor is at high voltage level;

wherein the output module comprises a capacitor, and one end of the capacitor is electrically coupled to the first node, and the other end is electrically coupled to the charging scan signal;

wherein the transmission module comprises an eleventh transistor, and a gate of the eleventh transistor is electrically coupled to the stage transfer signal of the n−2th stage GOA unit circuit, and a source is electrically coupled to the charging scan signal of the n−2th stage GOA unit circuit, and a drain is electrically coupled to the first node;

the pull-down holding module comprises a fifty-fifth transistor, a first pull-down holding module and a second pull-down holding module;

a gate of the fifty-fifth transistor is electrically coupled to the first node, and a source is electrically coupled to a second node, and a drain is electrically coupled to a third node;

the first pull-down holding module comprises a forty-second transistor, and a gate of the forty-second transistor is electrically coupled to the second node, and a source is electrically coupled to the first node, and a drain is electrically coupled to the direct current low voltage signal; a fifty-first transistor, and both a gate and a source of the fifty-first transistor are electrically coupled to the first low frequency clock signal, and a drain is electrically coupled to a gate of a fifty-third transistor; the fifty-third transistor, and the gate of the fifty-third transistor is electrically coupled to the drain of the fifty-first transistor, and a source is electrically coupled to the first low frequency clock signal, and a drain is electrically coupled to the second node; a fifty-fourth transistor, and a gate of the fifty-fourth transistor is electrically coupled to the second low frequency clock signal, and a source is electrically coupled to the first low frequency clock signal, and a drain is electrically coupled to the second node; a thirty-second transistor, and a gate of the thirty-second transistor is electrically coupled to the second node, and a source is electrically coupled to the charging scan signal, and a drain is electrically coupled to the direct current low voltage signal;

the second pull-down holding module comprises a forty-third transistor, and a gate of the forty-third transistor is electrically coupled to the third node, and a source is electrically coupled to the first node, and a drain is electrically coupled to the direct current low voltage signal; a sixty-first transistor, and both a gate and a source of the sixty-first transistor are electrically coupled to the second low frequency clock signal, and a drain is electrically coupled to a gate of a sixty-third transistor; the sixty-third transistor, and the gate of the sixty-third transistor is electrically coupled to the drain of the sixty-first transistor, and a source is electrically coupled to the second low frequency clock signal, and a drain is electrically coupled to the third node; a sixty-fourth transistor, and a gate of the sixty-fourth transistor is electrically coupled to the first low frequency clock signal, and a source is electrically coupled to the second low frequency clock signal, and a drain is electrically coupled to the third node; a thirty-third transistor, and a gate of the thirty-third transistor is electrically coupled to the third node, and a source is electrically coupled to the charging scan signal, and a drain is electrically coupled to the direct current low voltage signal;

the transfer regulation module comprises a fifty-second transistor, and a gate of the fifty-second transistor is electrically coupled to the first node, and a source is electrically coupled to the second node, and a drain is electrically coupled to the direct current low voltage signal; a sixty-second transistor, and a gate of the sixty-second transistor is electrically coupled to the first node, and a source is electrically coupled to the third node, and a drain is electrically coupled to the direct current low voltage signal; a fifty-sixth transistor, and a gate of the fifty-sixth transistor is electrically coupled to the stage transfer signal of the n−2th stage GOA unit circuit, and a source is electrically coupled to the drain of the fifty-first transistor, and a drain is electrically coupled to the direct current low voltage signal; a sixty-sixth transistor, and a gate of the sixty-sixth transistor is electrically coupled to the stage transfer signal of the n−2th stage GOA unit circuit, and a source is electrically coupled to the drain of the sixty-first transistor, and a drain is electrically coupled to the direct current low voltage signal;

the rapid pull-down module comprises a thirtieth transistor, and a gate of the thirtieth transistor is electrically coupled to the stage transfer signal of the n+2th stage GOA unit circuit, and a source is electrically coupled to the charge sharing scan signal of the n−2th stage GOA unit circuit, and a drain is electrically coupled to the direct current low voltage signal; a thirty-first transistor, and a gate of the thirty-first transistor is electrically coupled to the stage transfer signal of the n+2th stage GOA unit circuit, and a source is electrically coupled to the charging scan signal, and a drain is electrically coupled to the direct current low voltage signal; a forty-first transistor, and a gate of the forty-first transistor is electrically coupled to the stage transfer signal of the n+2th stage GOA unit circuit, and a source is electrically coupled to the first node, and a drain is electrically coupled to the direct current low voltage signal;

wherein all the four high frequency clock signals are divided into a charging scan output part and a charge sharing scan output part in one period; a time width that the charging scan output part of the Mth high frequency clock signal is at high voltage level is larger than a time width that the charge sharing scan output part of the M-2th high frequency clock signal is at high voltage level;

wherein voltage levels of the first, the second frequency clock signals are reversed every other frame or multiple frames.

The benefits of the present invention are: the charging scan and charge sharing scan double output GOA circuit provided by the present invention combines the time sequence and circuit to realize that the charging scan signal and the charge sharing scan are respectively outputted by two different high frequency clock signals via one TFT at the same time, and the output waveforms of the charging scan signal and the charge sharing scan signal are controlled by the corresponding specifications of the TFTs. The IC instant current can be diminished to lower the loading of the IC and to raise the flexibility of the color shift design.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
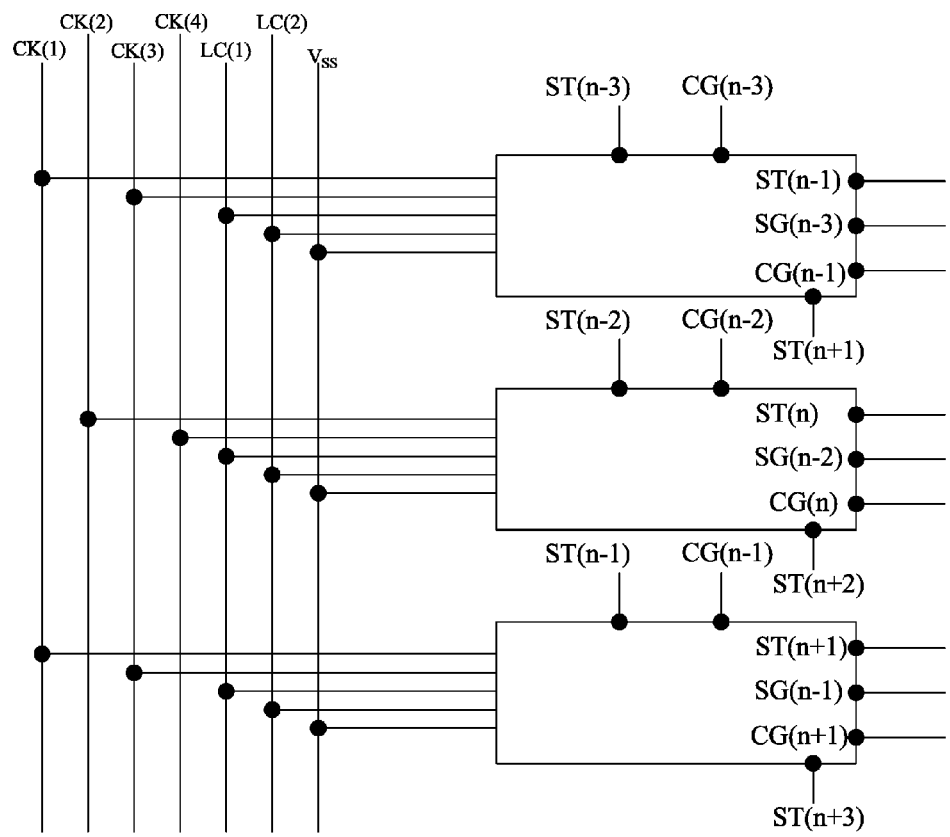
FIG. 1 is a multi-stage structure diagram of a charging scan and charge sharing scan double output GOA circuit according to the present invention.
Figure 2:
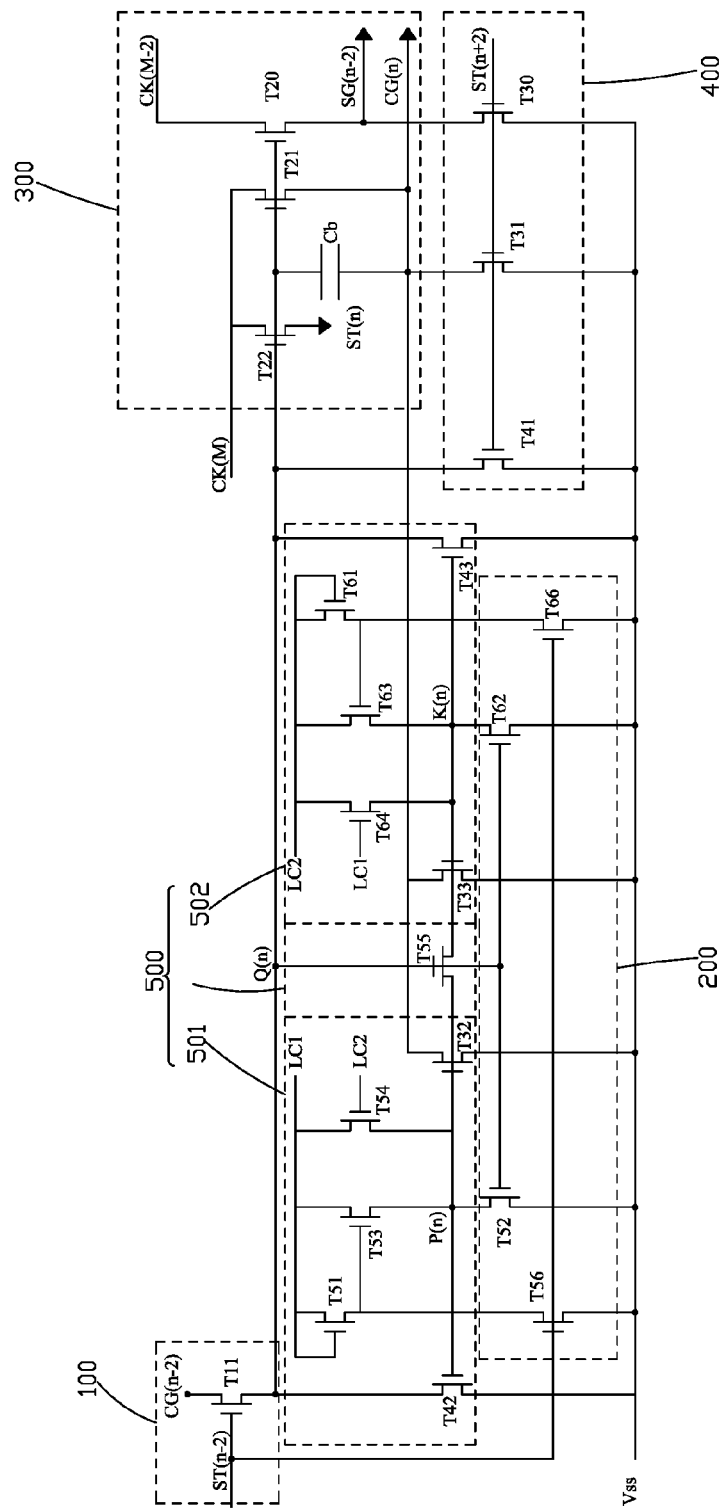
FIG. 2 is a circuit diagram of a nth stage GOA unit in the charging scan and charge sharing scan double output GOA circuit according to the present invention.
Figure 7:
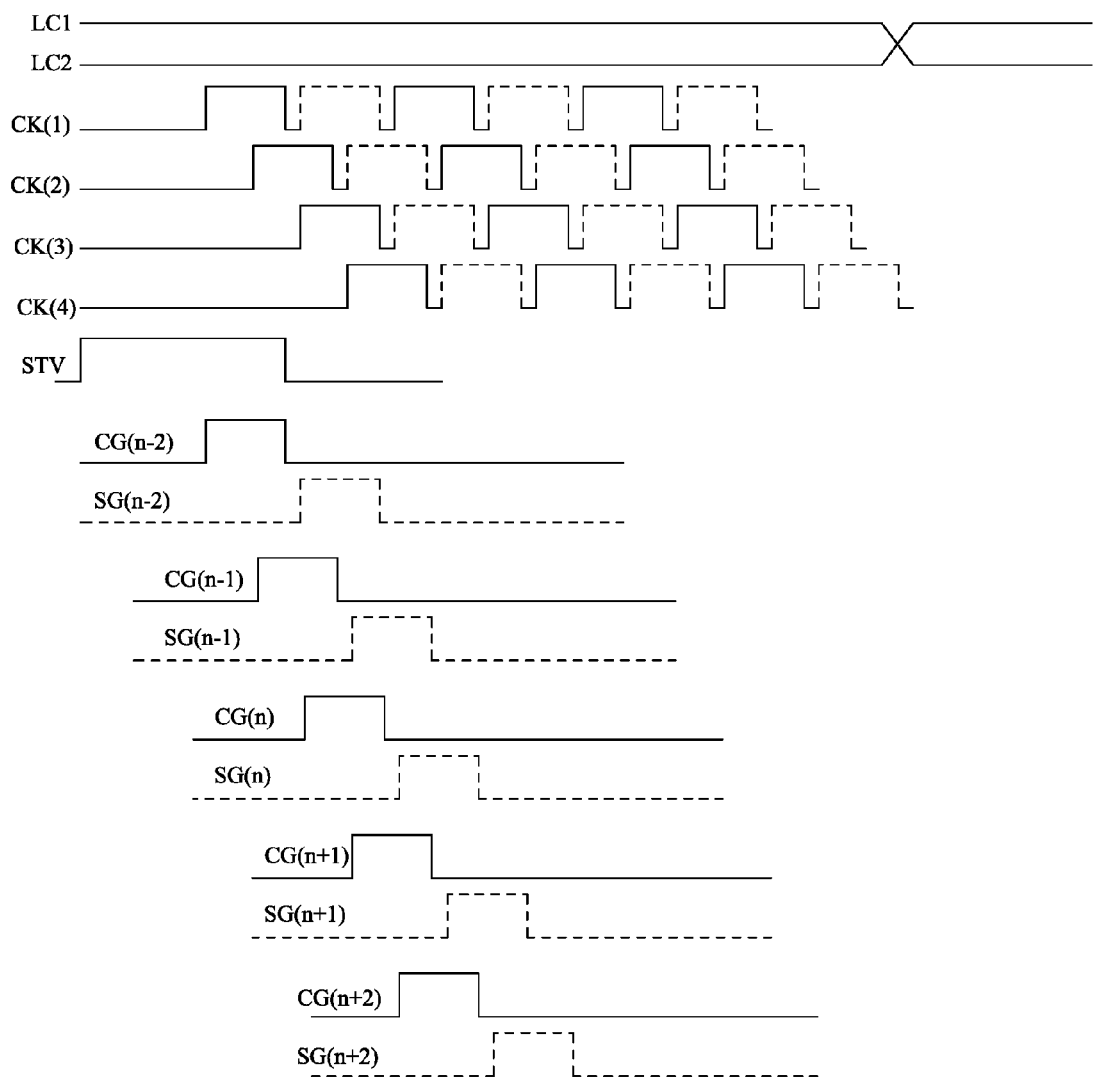
FIG. 7 is a sequence diagram of the charging scan and charge sharing scan double output GOA circuit according to the present invention.

Referring to FIGS. 1, 2 and 7, the present invention provides a charging scan and charge sharing scan double output GOA circuit.

As shown in FIG. 1, the charging scan and charge sharing scan double output GOA circuit comprises a plurality of GOA unit circuits which are cascade connected, and a first, a second low frequency clock signals LC1, LC2, a direct current low voltage signal Vss and four metal lines of high frequency clock signals CK(1), CK(2), CK(3), CK(4) located at periphery of the GOA unit circuits of respective stages. N is set to be a positive integer and the nth stage GOA unit circuit receives the first, the second low frequency clock signals LC1, LC2, the direct current low voltage signal Vss, Mth, M-2th high frequency clock signals CK(M), CK(M-2), a stage transfer signal ST(n-2) generated by the n-2th stage GOA unit circuit, a charging scan signal CG(n-2) generated by the n-2th stage GOA unit circuit and a stage transfer signal ST(n+2) generated by the n+2th stage GOA unit circuit, and the charging scan signal CG(n), a charge sharing scan signal SG(n-2) of the n-2th stage GOA unit circuit and the stage transfer signal ST(n) are respectively outputted with different TFTs. Such structure can ensure that the GOA signal can be transferred stage by stage to charge and discharge the level scan lines of respective stages stage by stage.

In combination with FIG. 7, the four high frequency clock signals CK(1), CK(2), CK(3), CK(4) are divided into a charging scan output part indicated by full line and a charge sharing scan output part indicated by dot line in one period; a time width that the charging scan output part of the Mth high frequency clock signal CK(M) is at high voltage level is larger than a time width that the charge sharing scan output part of the M-2th high frequency clock signal CK(M-2) is at high voltage level. As the Mth high frequency clock signal CK(M) is the first high frequency clock signal CK(1), the M-2th high frequency clock signal CK(M-2) is the third high frequency clock signal CK(3); as the Mth high frequency clock signal CK(M) is the second high frequency clock signal CK(2), the M-2th high frequency clock signal CK(M-2) is the fourth high frequency clock signal CK(4). As regarding the GOA unit circuits of two adjacent stages, the first high frequency clock signal CK(1) and the third high frequency clock signal CK(3) are received by one stage, and the second high frequency clock signal CK(2) and the fourth high frequency clock signal CK(4) are received by the other stage. For the liquid crystal display panels of different resolutions, the time delays among the four high frequency clock signals CK(1), CK(2), CK(3), CK(4) are uncertain and can be determined according to the actual resolution of the liquid crystal display panel. Nevertheless, the high voltage level overlaps among the adjacent high frequency clock signals have to be consistent.

Voltage levels of the first, the second frequency clock signals LC1, LC2 are reversed every other frame or multiple frames.

Furthermore, as shown in FIG. 2, the nth stage GOA unit circuit comprises a transmission module 100, a transfer regulation module 200, an output module 300, a rapid pull-down module 400 and a pull-down holding module 500.

The output module 300 comprises a twentieth transistor T20, and a gate of the twentieth transistor T20 is coupled to a first node Q(n), and a source is coupled to the M-2th high frequency clock signal CK(M-2), and a drain is coupled to the charge sharing scan signal SG(n-2) of the n-2th stage GOA unit circuit; the twentieth transistor T20 is employed to output the charge sharing scan signal SG(n-2) of the n-2th stage GOA unit circuit according to the M-2th high frequency clock signal CK(M-2) as the first node Q(n) is at high voltage level, and an output waveform of the charge sharing scan signal SG(n-2) of the n-2th stage GOA unit circuit is controlled by a specification of the twentieth transistor T20;

a twenty-first transistor T21, and a gate of the twenty-first transistor T21 is electrically coupled to the first node Q(n), and a source is electrically coupled to the Mth high frequency clock signal CK(M), and a drain outputs the charging scan signal CG(n); the twenty-first transistor T21 is employed to output the charging scan signal CG(n) according to the Mth high frequency clock signal CK(M) as the first node Q(n) is at high voltage level, and an output waveform of the charging scan signal CG(n) is controlled by a specification of the twenty-first transistor T21;

a twenty-second transistor T22, and a gate of the twenty-second transistor T22 is electrically coupled to the first node Q(n), and a source is electrically coupled to the Mth high frequency clock signal CK(M), and a drain outputs the stage transfer signal ST(n); the twenty-second transistor T22 is employed to output the stage transfer signal ST(n) according to the Mth high frequency clock signal CK(M) as the first node Q(n) is at high voltage level;

The output module 300 further comprises a capacitor Cb, and one end of the capacitor Cb is electrically coupled to the first node Q(N), and the other end is electrically coupled to the charging scan signal CG(n).

The transmission module 100 comprises an eleventh transistor T11, and a gate of the eleventh transistor T11 is electrically coupled to the stage transfer signal ST(n−2) of the n−2th stage GOA unit circuit, and a source is electrically coupled to the charging scan signal CG(n−2) of the n−2th stage GOA unit circuit, and a drain is electrically coupled to the first node Q(n).

The pull-down holding module 500 comprises a fifty-fifth transistor T55, a first pull-down holding module 501 and a second pull-down holding module 502. A gate of the fifty-fifth transistor T55 is electrically coupled to the first node Q(n), and a source is electrically coupled to a second node P(n), and a drain is electrically coupled to a third node K(n). The first pull-down holding module 501 comprises a forty-second transistor T42, and a gate of the forty-second transistor T42 is electrically coupled to the second node P(n), and a source is electrically coupled to the first node Q(n), and a drain is electrically coupled to the direct current low voltage signal Vss; a fifty-first transistor T51, and both a gate and a source of the fifty-first transistor T51 are electrically coupled to the first low frequency clock signal LC1, and a drain is electrically coupled to a gate of a fifty-third transistor T53; the fifty-third transistor T53, and the gate of the fifty-third transistor T53 is electrically coupled to the drain of the fifty-first transistor T51, and a source is electrically coupled to the first low frequency clock signal LC1, and a drain is electrically coupled to the second node P(n); a fifty-fourth transistor T54, and a gate of the fifty-fourth transistor T54 is electrically coupled to the second low frequency clock signal LC2, and a source is electrically coupled to the first low frequency clock signal LC1, and a drain is electrically coupled to the second node P(n); a thirty-second transistor T32, and a gate of the thirty-second transistor T32 is electrically coupled to the second node P(n), and a source is electrically coupled to the charging scan signal CG(n), and a drain is electrically coupled to the direct current low voltage signal Vss. The second pull-down holding module 502 comprises a forty-third transistor T43, and a gate of the forty-third transistor T43 is electrically coupled to the third node K(n), and a source is electrically coupled to the first node Q(n), and a drain is electrically coupled to the direct current low voltage signal Vss; a sixty-first transistor T61, and both a gate and a source of the sixty-first transistor T61 are electrically coupled to the second low frequency clock signal LC2, and a drain is electrically coupled to a gate of a sixty-third transistor T63; the sixty-third transistor T63, and the gate of the sixty-third transistor T63 is electrically coupled to the drain of the sixty-first transistor T61, and a source is electrically coupled to the second low frequency clock signal LC2, and a drain is electrically coupled to the third node K(n); a sixty-fourth transistor T64, and a gate of the sixty-fourth transistor T64 is electrically coupled to the first low frequency clock signal LC1, and a source is electrically coupled to the second low frequency clock signal LC2, and a drain is electrically coupled to the third node K(n); a thirty-third transistor T33, and a gate of the thirty-third transistor T33 is electrically coupled to the third node K(n), and a source is electrically coupled to the charging scan signal CG(n), and a drain is electrically coupled to the direct current low voltage signal Vss.

The transfer regulation module 200 comprises a fifty-second transistor T52, and a gate of the fifty-second transistor T52 is electrically coupled to the first node Q(n), and a source is electrically coupled to the second node P(n), and a drain is electrically coupled to the direct current low voltage signal Vss; a sixty-second transistor T62, and a gate of the sixty-second transistor T62 is electrically coupled to the first node Q(n), and a source is electrically coupled to the third node K(n), and a drain is electrically coupled to the direct current low voltage signal Vss; a fifty-sixth transistor T56, and a gate of the fifty-sixth transistor T56 is electrically coupled to the stage transfer signal ST(n−2) of the n−2th stage GOA unit circuit, and a source is electrically coupled to the drain of the fifty-first transistor T51, and a drain is electrically coupled to the direct current low voltage signal Vss; a sixty-sixth transistor T66, and a gate of the sixty-sixth transistor T66 is electrically coupled to the stage transfer signal ST(n−2) of the n−2th stage GOA unit circuit, and a source is electrically coupled to the drain of the sixty-first transistor T61, and a drain is electrically coupled to the direct current low voltage signal Vss.

The rapid pull-down module 400 comprises a thirtieth transistor T30, and a gate of the thirtieth transistor T30 is electrically coupled to the stage transfer signal ST(n+2) of the n+2th stage GOA unit circuit, and a source is electrically coupled to the charge sharing scan signal SG(n−2) of the n−2th stage GOA unit circuit, and a drain is electrically coupled to the direct current low voltage signal Vss; a thirty-first transistor T31, and a gate of the thirty-first transistor T31 is electrically coupled to the stage transfer signal ST(n+2) of the n+2th stage GOA unit circuit, and a source is electrically coupled to the charging scan signal CG(n), and a drain is electrically coupled to the direct current low voltage signal Vss; a forty-first transistor T41, and a gate of the forty-first transistor T41 is electrically coupled to the stage transfer signal ST(n+2) of the n+2th stage GOA unit circuit, and a source is electrically coupled to the first node Q(n), and a drain is electrically coupled to the direct current low voltage signal Vss.

Figure 3:
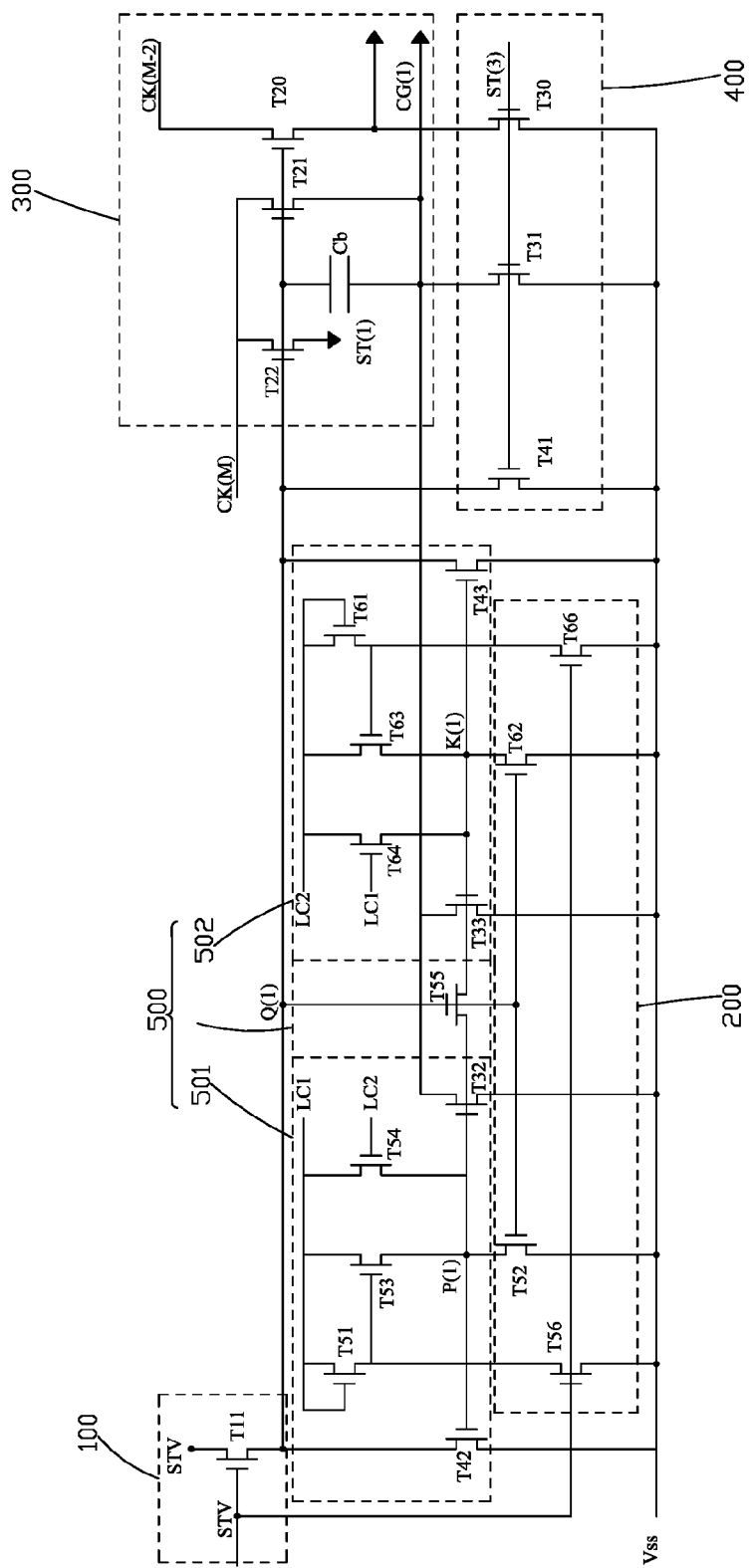
FIG. 3 is a circuit diagram of a first stage GOA unit in the charging scan and charge sharing scan double output GOA circuit according to the present invention.
Figure 4:
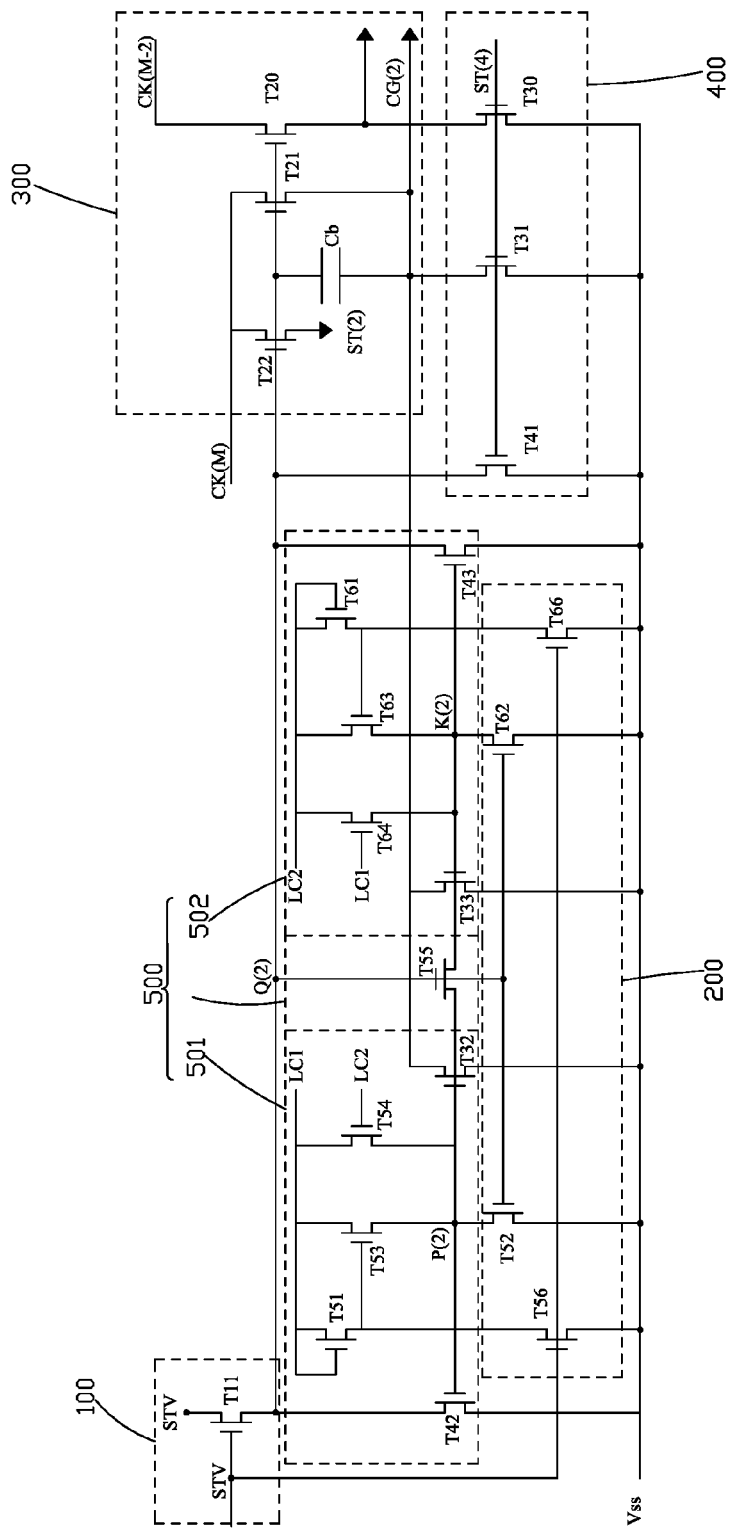
FIG. 4 is a circuit diagram of a second stage GOA unit in the charging scan and charge sharing scan double output GOA circuit according to the present invention.

Particularly, as shown in FIG. 3, in a first stage connection of the charging scan and charge sharing scan double output GOA circuit, both the gate and the source of the eleventh transistor T11 are electrically coupled to a start signal SW of the circuit, and merely the drain of the twenty-first transistor T21 normally outputs the charging scan signal CG(1) of the first stage GOA unit circuit and the drain of the twentieth transistor T20 outputs nothing, i.e. a low voltage level. As shown in FIG. 4, in a second stage connection of the charging scan and charge sharing scan double output GOA circuit, both the gate and the source of the eleventh transistor T11 are electrically coupled to a start signal SW of the circuit, and merely the drain of the twenty-first transistor T21 normally outputs the charging scan signal CG(2) of the second stage GOA unit circuit and the drain of the twentieth transistor T20 outputs nothing, i.e. a low voltage level.

Figure 5:
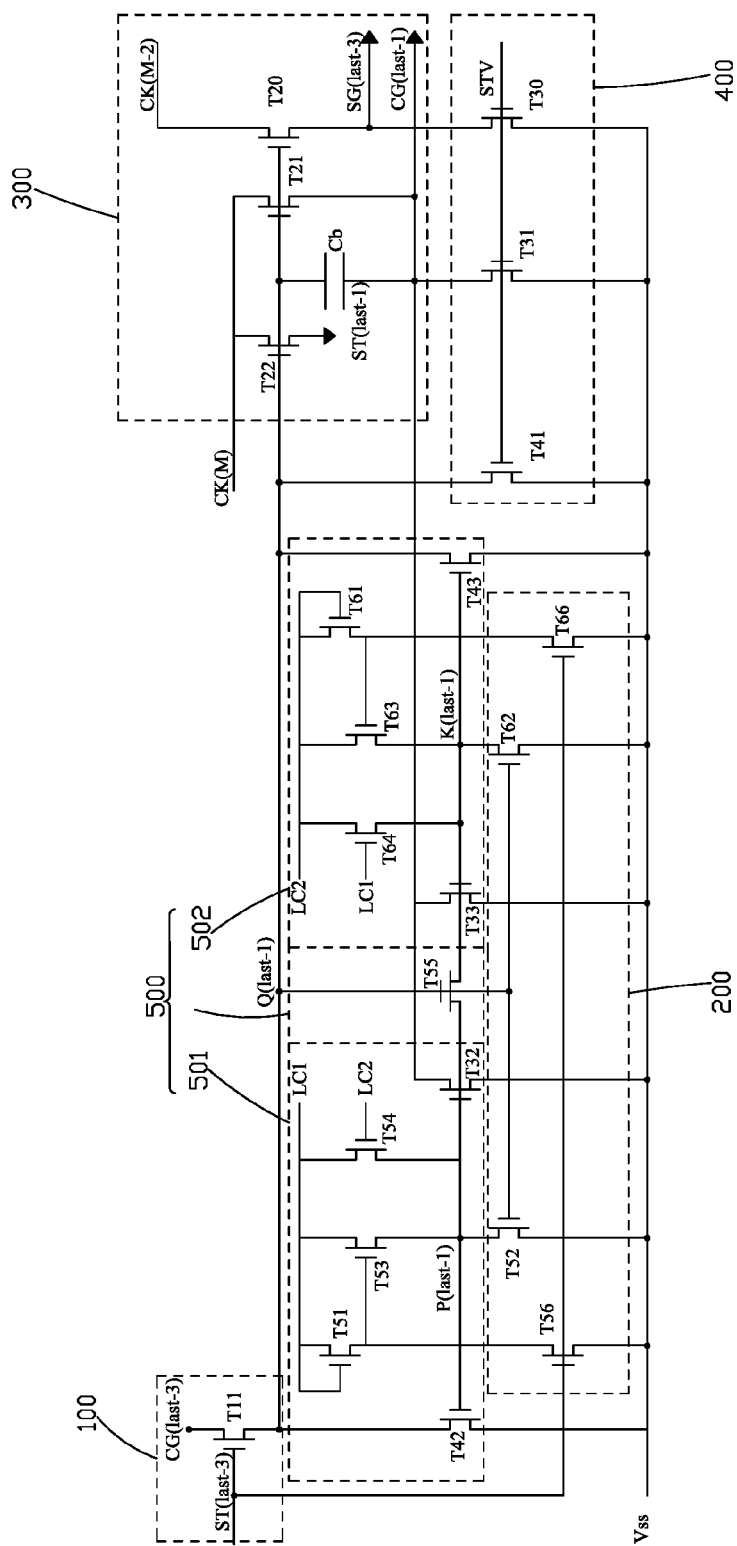
FIG. 5 is a circuit diagram of a last but one stage GOA unit in the charging scan and charge sharing scan double output GOA circuit according to the present invention.
Figure 6:
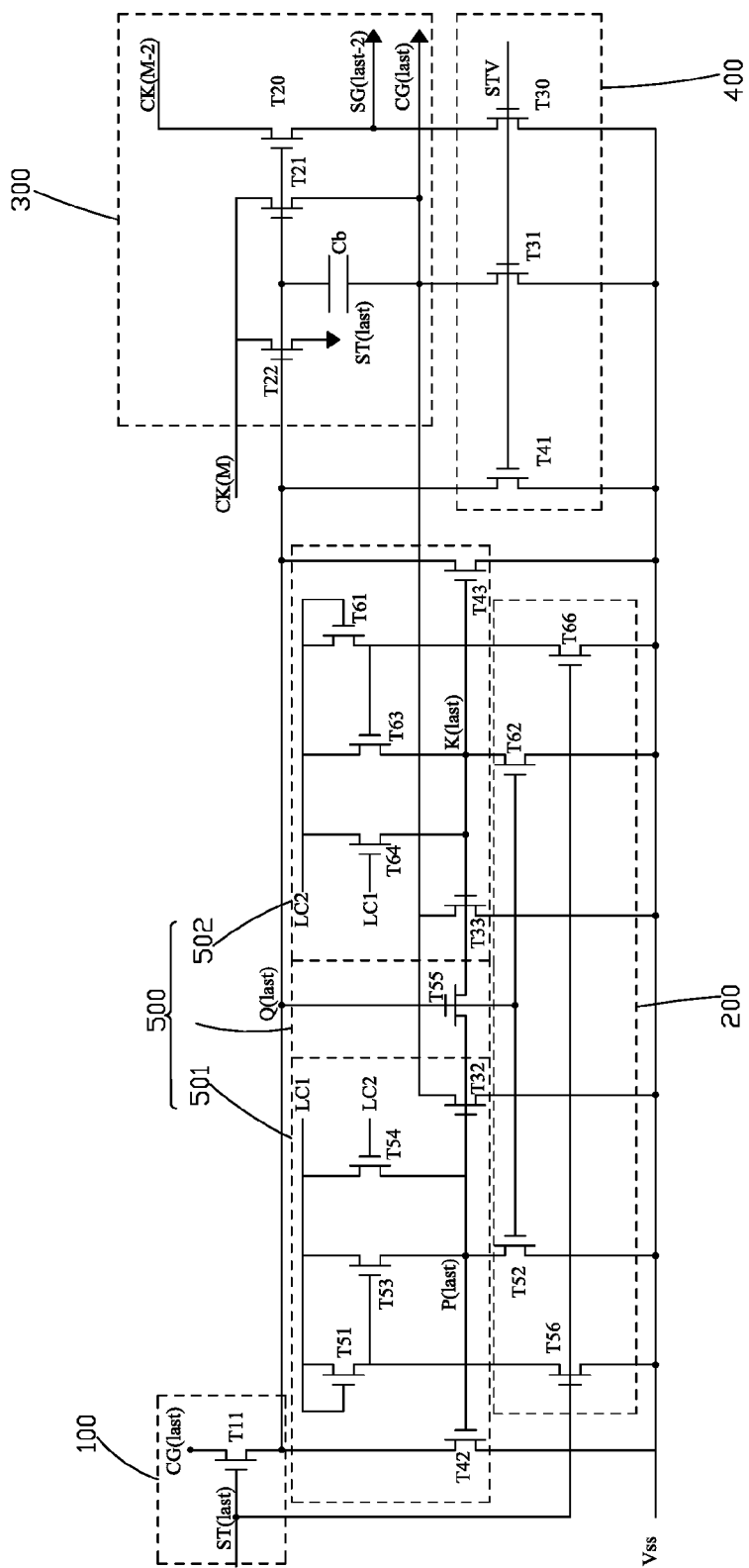
FIG. 6 is a circuit diagram of a last stage GOA unit in the charging scan and charge sharing scan double output GOA circuit according to the present invention.

As shown in FIGS. 5 and 6, in a last stage and a last but one stage connections of the charging scan and charge sharing scan double output GOA circuit, all the gate of the thirtieth transistor T30, the gate of the thirty-first transistor T31 and the gate of the forty-first transistor T41 are electrically coupled to a start signal STV of the circuit.

Referring to FIGS. 1, 2 and 7, the specific working procedure of the charging scan and charge sharing scan double output GOA circuit according to the present invention is as follows.

The nth stage GOA unit circuit receives the stage transfer signal ST(n−2) and the charging scan signal CG(n−2) from the n−2th stage GOA unit circuit. Because the stage transfer signal ST(n−2) and the charging scan signal CG(n−2) from the n−2th stage GOA unit circuit are signals outputted according to the same high frequency clock signal, the sequences and voltage levels of the stage transfer signal ST(n−2) and the charging scan signal CG(n−2) from the n−2th stage GOA unit circuit are the same. As they are at high voltage level, the eleventh transistor T11 is activated, and the first node Q(n) is charged, and meanwhile, the fifty-sixth transistor T56 and the sixty-sixth transistor T66 are activated to pull down the voltage levels of the second, the third nodes P(n), K(n); then, the first node Q(n) is charged to be high voltage level, and the fifty-second transistor T52, the sixty-second transistor T62 and the fifty-fifth transistor T55 controlled by the voltage level of the first node Q(n) are activated to pull down the voltage levels of the second, the third nodes P(n), K(n) in advance, and the thirty-second transistor T32, the thirty-third transistor T33, the forty-second transistor T42 and the forty-third transistor T43 are deactivated. Meanwhile, the twentieth transistor T20, the twenty-first transistor T21 and the twenty-second transistor T22 similarly controlled by the voltage level of the first node Q(n) are activated. At this moment, both the Mth, the M−2th high frequency clock signals CK(M), CK(M−2) are low voltage levels. The charging scan signal CG(n), the stage transfer signal ST(n) outputted by the nth stage GOA unit circuit according to the Mth high frequency clock signals CK(M) and the charge sharing scan signal SG(n−2) outputted by the n−2th stage GOA unit circuit according to the M−2th high frequency clock signals CK(M−2) are all low voltage levels.

As the scan activation signal ST(n−2) and the charging scan signal CG(n−2) of the n−2th GOA unit circuit are low voltage levels, the eleventh transistor T11 is deactivated, and the first node Q(n) maintains to be high voltage level, and the twentieth transistor T20, the twenty-first transistor T21 and the twenty-second transistor T22 are still activated; as the Mth, the M−2th high frequency clock signals CK(M), CK(M−2) become high voltage levels, the charging scan signal CG(n), the stage transfer signal ST(n) outputted according to the Mth high frequency clock signals CK(M) and the charge sharing scan signal SG(n−2) outputted by the n−2th stage GOA unit circuit according to the M−2th high frequency clock signals CK(M−2) smoothly output high voltage levels. Meanwhile, under the coupling of the capacitor Cb, the first node Q(n) is raised to be higher voltage level, and the gate-source voltages (threshold voltages) Vgs of the twentieth transistor T20, the twenty-first transistor T21 and the twenty-second transistor T22 basically maintain unchanged for ensuring the smooth outputs of the charging scan signal CG(n), the stage transfer signal ST(n) and the charge sharing scan signal SG(n−2) of the n−2th stage GOA unit circuit in advance. Furthermore, the fifty-second transistor T52, the sixty-second transistor T62 and the fifty-fifth transistor T55, the fifty-sixth transistor T56 and the sixty-sixth transistor T66 are activated to pull down the second node P(n), the third node K(n), and the thirty-second transistor T32, the thirty-third transistor T33, the forty-second transistor T42 and the forty-third transistor T43 are deactivated to prevent the voltage level drop of the first node Q(n) to ensure that the outputs of the charging scan signal CG(n), the stage transfer signal ST(n) and the charge sharing scan signal SG(n−2) of the n−2th stage GOA unit circuit are not affected.

Next, as the Mth, the M−2th high frequency clock signals CK(M), CK(M−2) become low voltage levels, the stage transfer signal ST(n+2) of the n+2th stage GOA unit circuit becomes high voltage level, and the forty-first transistor T41, the thirty-first transistor T31 and the thirtieth transistor T30 are activated to respectively pull down the voltage levels of the first node Q(n), the charging scan signal CG(n), the stage transfer signal ST(n) and the charge sharing scan signal SG(n−2) of the n−2th stage GOA unit circuit; meanwhile, the fifty-second transistor T52, the sixty-second transistor T62 and the fifty-fifth transistor T55 are deactivated; the first low frequency clock signal LC1 or the second low frequency clock signal LC2 charges the second node P(n) or the third node K(n), and the second node P(n) or the third node K(n) is high voltage level, and the thirty-second transistor T32 and the forty-second transistor T42 or the thirty-third transistor T33 and the forty-third transistor T43 are activated to respectively pull down the voltage levels of the first node Q(n) and the charging scan signal CG(n).

When on frame or a plurality of frames are accomplished, the first low frequency clock signal LC1 and the second low frequency clock signal LC2 are reversed once, i.e. the first low frequency clock signal LC1 and the second low frequency clock signal LC2 alternate to be high voltage levels to respectively charge the second node P(n) or the third node K(n). The thirty-second transistor T32 and the forty-second transistor T42 as one set, the thirty-third transistor T33 and the forty-third transistor T43 as one set alternate to be activated to maintain the first node Q(n) and the charging scan signal CG(n) to be low voltage level.

Significantly, in the nth stage GOA unit circuit, the M−2th high frequency clock signal CK(M−2) outputs the charge sharing scan signal SG(n−2) of the n−2th stage GOA unit circuit through the twentieth transistor T20, and the Mth high frequency clock signal CK(M) respectively outputs the stage transfer signal ST(n) and the charging scan signal CG(n) through the twenty-first transistor T21 and the twenty-second transistor T22. By adjusting the specifications of the twentieth transistor T20 and the twenty-first transistor T21, the output waveforms of the charge sharing scan signal SG(n−2) of the n−2th stage GOA unit circuit and the charging scan signal CG(n) can be changed.

As shown in FIG. 7, the present invention realizes that the charging scan signal and the charge sharing scan are respectively outputted by two different high frequency clock signals via one TFT at the same time.

In conclusion, the charging scan and charge sharing scan double output GOA circuit provided of the present invention combines the time sequence and circuit to realize that the charging scan signal and the charge sharing scan are respectively outputted by two different high frequency clock signals via one TFT at the same time, and the output waveforms of the charging scan signal and the charge sharing scan signal are controlled by the corresponding specifications of the TFTs. The IC instant current can be diminished to lower the loading of the IC and to raise the flexibility of the color shift design.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A charging scan and charge sharing scan double output gate driver on array (GOA) circuit, comprising a plurality of GOA unit circuits which are cascade connected, and a first and a second low frequency clock signals, a direct current low voltage signal and four metal lines of high frequency clock signals located at periphery of the GOA unit circuits of respective stages, wherein for an nth stage of GOA unit circuits, where n is a positive, integer and the nth stage GOA unit circuit receives the first and the second low frequency clock signals, the direct current low voltage signal, Mth and M−2th high frequency clock signals, a stage transfer signal generated by the n−2th stage GOA unit circuit, a charging scan signal generated by the n−2th stage GOA unit circuit and a stage transfer signal generated by the n+2th stage GOA unit circuit, the charging scan signal, a charge sharing scan signal generated by the n−2th stage GOA unit circuit and the stage transfer signal are respectively outputted with different TFTs;

wherein the nth stage GOA unit circuit comprises a transmission module, a transfer regulation module, an output module, a rapid pull-down module and a pull-down holding module;

wherein the output module comprises a twentieth transistor, and a gate of the twentieth transistor is coupled to a first node, and a source is coupled to the M−2th high frequency clock signal, and a drain is coupled to the charge sharing scan signal of the n−2th stage GOA unit circuit; the twentieth transistor is employed to output the charge sharing scan signal of the n−2th stage GOA unit circuit according to the M−2th high frequency clock signal as the first node is at high voltage level;

a twenty-first transistor, and a gate of the twenty-first transistor is electrically coupled to the first node, and a source is electrically coupled to the Mth high frequency clock signal, and a drain outputs the charging scan signal; the twenty-first transistor is employed to output the charging scan signal according to the Mth high frequency clock signal as the twenty-first transistor is at high voltage level;

a twenty-second transistor, and a gate of the twenty-second transistor is electrically coupled to the first node, and a source is electrically coupled to the Mth high frequency clock signal, and a drain outputs the stage transfer signal; the twenty-second transistor is employed to output the stage transfer signal according to the Mth high frequency clock signal as the twenty-second transistor is at high voltage level;

wherein the transmission module comprises an eleventh transistor, and a gate of the eleventh transistor is electrically coupled to the stage transfer signal of the n−2th stage GOA unit circuit, and a source is electrically coupled to the charging scan signal of the n−2th stage GOA unit circuit, and a drain is electrically coupled to the first node;

wherein for a first stage and a second stage GOA unit circuits, the gate and the source of the eleventh transistor are electrically coupled to a start signal and the twentieth transistor outputs a low voltage level.

2. The charging scan and charge sharing scan double output GOA circuit according to claim 1, wherein the output module comprises a capacitor, and one end of the capacitor is electrically coupled to the first node, and the other end is electrically coupled to the charging scan signal.

3. The charging scan and charge sharing scan double output GOA circuit according to claim 1, wherein the pull-down holding module comprises a fifty-fifth transistor, a first pull-down holding module and a second pull-down holding module;

a gate of the fifty-fifth transistor is electrically coupled to the first node, and a source is electrically coupled to a second node, and a drain is electrically coupled to a third node;

the first pull-down holding module comprises a forty-second transistor, and a gate of the forty-second transistor is electrically coupled to the second node, and a source is electrically coupled to the first node, and a drain is electrically coupled to the direct current low voltage signal; a fifty-first transistor, and both a gate and a source of the fifty-first transistor are electrically coupled to the first low frequency clock signal, and a drain is electrically coupled to a gate of a fifty-third transistor; the fifty-third transistor, and the gate of the fifty-third transistor is electrically coupled to the drain of the fifty-first transistor, and a source is electrically coupled to the first low frequency clock signal, and a drain is electrically coupled to the second node; a fifty-fourth transistor, and a gate of the fifty-fourth transistor is electrically coupled to the second low frequency clock signal, and a source is electrically coupled to the first low frequency clock signal, and a drain is electrically coupled to the second node; a thirty-second transistor, and a gate of the thirty-second transistor is electrically coupled to the second node, and a source is electrically coupled to the charging scan signal, and a drain is electrically coupled to the direct current low voltage signal;

the second pull-down holding module comprises a forty-third transistor, and a gate of the forty-third transistor is electrically coupled to the third node, and a source is electrically coupled to the first node, and a drain is electrically coupled to the direct current low voltage signal; a sixty-first transistor, and both a gate and a source of the sixty-first transistor are electrically coupled to the second low frequency clock signal, and a drain is electrically coupled to a gate of a sixty-third transistor; the sixty-third transistor, and the gate of the sixty-third transistor is electrically coupled to the drain of the sixty-first transistor, and a source is electrically coupled to the second low frequency clock signal, and a drain is electrically coupled to the third node; a sixty-fourth transistor, and a gate of the sixty-fourth transistor is electrically coupled to the first low frequency clock signal, and a source is electrically coupled to the second low frequency clock signal, and a drain is electrically coupled to the third node; a thirty-third transistor, and a gate of the thirty-third transistor is electrically coupled to the third node, and a source is electrically coupled to the charging scan signal, and a drain is electrically coupled to the direct current low voltage signal;

the transfer regulation module comprises a fifty-second transistor, and a gate of the fifty-second transistor is electrically coupled to the first node, and a source is electrically coupled to the second node, and a drain is electrically coupled to the direct current low voltage signal; a sixty-second transistor, and a gate of the sixty-second transistor is electrically coupled to the first node, and a source is electrically coupled to the third node, and a drain is electrically coupled to the direct current low voltage signal; a fifty-sixth transistor, and a gate of the fifty-sixth transistor is electrically coupled to the stage transfer signal of the n−2th stage GOA unit circuit, and a source is electrically coupled to the drain of the fifty-first transistor, and a drain is electrically coupled to the direct current low voltage signal; a sixty-sixth transistor, and a gate of the sixty-sixth transistor is electrically coupled to the stage transfer signal of the n−2th stage GOA unit circuit, and a source is electrically coupled to the drain of the sixty-first transistor, and a drain is electrically coupled to the direct current low voltage signal;

the rapid pull-down module comprises a thirtieth transistor, and a gate of the thirtieth transistor is electrically coupled to the stage transfer signal of the n+2th stage GOA unit circuit, and a source is electrically coupled to the charge sharing scan signal of the n−2th stage GOA unit circuit, and a drain is electrically coupled to the direct current low voltage signal; a thirty-first transistor, and a gate of the thirty-first transistor is electrically coupled to the stage transfer signal of the n+2th stage GOA unit circuit, and a source is electrically coupled to the charging scan signal, and a drain is electrically coupled to the direct current low voltage signal; a forty-first transistor, and a gate of the forty-first transistor is electrically coupled to the stage transfer signal of the n+2th stage GOA unit circuit, and a source is electrically coupled to the first node, and a drain is electrically coupled to the direct current low voltage signal.

4. The charging scan and charge sharing scan double output GOA circuit according to claim 1, wherein an output waveform of the charging scan signal is controlled by a specification of the twenty-first transistor; an output waveform of the charge sharing scan signal of the n−2th stage GOA unit circuit is controlled by a specification of the twentieth transistor.

5. The charging scan and charge sharing scan double output GOA circuit according to claim 1, wherein all the four high frequency clock signals are divided into a charging scan output part and a charge sharing scan output part in one period; a time width that the charging scan output part of the Mth high frequency clock signal is at high voltage level is larger than a time width that the charge sharing scan output part of the M−2th high frequency clock signal is at high voltage level.

6. The charging scan and charge sharing scan double output GOA circuit according to claim 5, wherein as the Mth high frequency clock signal is the first high frequency clock signal, the M−2th high frequency clock signal is the third high frequency clock signal; as the Mth high frequency clock signal is the second high frequency clock signal, the M−2th high frequency clock signal is the fourth high frequency clock signal.

7. The charging scan and charge sharing scan double output GOA circuit according to claim 1, wherein voltage levels of the first and the second frequency clock signals are reversed every other frame or multiple frames.

8. A charging scan and charge sharing scan double output GOA circuit, comprising a plurality of GOA unit circuits which are cascade connected, and a first and a second low frequency clock signals, a direct current low voltage signal and four metal lines of high frequency clock signals located at periphery of the GOA unit circuits of respective stages; for an nth stage of the GOA unit circuits, where n is a positive integer, the nth stage GOA unit circuit receives the first and second low frequency clock signals, the direct current low voltage signal, Mth and M−2th high frequency clock signals, a stage transfer signal generated by the n−2th stage GOA unit circuit, a charging scan signal generated by the n−2th stage GOA unit circuit and a stage transfer signal generated by the n+2th stage GOA unit circuit, the charging scan signal, a charge sharing scan signal generated by the n−2th stage GOA unit circuit and the stage transfer signal are respectively outputted with different TFTs;

wherein the nth stage GOA unit circuit comprises a transmission module, a transfer regulation module, an output module, a rapid pull-down module and a pull-down holding module;

wherein the output module comprises a twentieth transistor, and a gate of the twentieth transistor is coupled to a first node, and a source is coupled to the M−2th high frequency clock signal, and a drain is coupled to the charge sharing scan signal of the n−2th stage GOA unit circuit; the twentieth transistor is employed to output the charge sharing scan signal of the n−2th stage GOA unit circuit according to the M−2th high frequency clock signal as the first node is at high voltage level;

a twenty-first transistor, and a gate of the twenty-first transistor is electrically coupled to the first node, and a source is electrically coupled to the Mth high frequency clock signal, and a drain outputs the charging scan signal; the twenty-first transistor is employed to output the charging scan signal according to the Mth high frequency clock signal as the twenty-first transistor is at high voltage level;

a twenty-second transistor, and a gate of the twenty-second transistor is electrically coupled to the first node, and a source is electrically coupled to the Mth high frequency clock signal, and a drain outputs the stage transfer signal; the twenty-second transistor is employed to output the stage transfer signal according to the Mth high frequency clock signal as the twenty-second transistor is at high voltage level;

wherein the output module comprises a capacitor, and one end of the capacitor is electrically coupled to the first node, and the other end is electrically coupled to the charging scan signal;

wherein the transmission module comprises an eleventh transistor, and a gate of the eleventh transistor is electrically coupled to the stage transfer signal of the n−2th stage GOA unit circuit, and a source is electrically coupled to the charging scan signal of the n−2th stage GOA unit circuit, and a drain is electrically coupled to the first node;

wherein the pull-down holding module comprises a fifty-fifth transistor, a first pull-down holding module and a second pull-down holding module;

a gate of the fifty-fifth transistor is electrically coupled to the first node, and a source is electrically coupled to a second node, and a drain is electrically coupled to a third node;

wherein the first pull-down holding module comprises a forty-second transistor, and a gate of the forty-second transistor is electrically coupled to the second node, and a source is electrically coupled to the first node, and a drain is electrically coupled to the direct current low voltage signal; a fifty-first transistor, and both a gate and a source of the fifty-first transistor are electrically coupled to the first low frequency clock signal, and a drain is electrically coupled to a gate of a fifty-third transistor; the fifty-third transistor, and the gate of the fifty-third transistor is electrically coupled to the drain of the fifty-first transistor, and a source is electrically coupled to the first low frequency clock signal, and a drain is electrically coupled to the second node; a fifty-fourth transistor, and a gate of the fifty-fourth transistor is electrically coupled to the second low frequency clock signal, and a source is electrically coupled to the first low frequency clock signal, and a drain is electrically coupled to the second node; a thirty-second transistor, and a gate of the thirty-second transistor is electrically coupled to the second node, and a source is electrically coupled to the charging scan signal, and a drain is electrically coupled to the direct current low voltage signal;

wherein the second pull-down holding module comprises a forty-third transistor, and a gate of the forty-third transistor is electrically coupled to the third node, and a source is electrically coupled to the first node, and a drain is electrically coupled to the direct current low voltage signal; a sixty-first transistor, and both a gate and a source of the sixty-first transistor are electrically coupled to the second low frequency clock signal, and a drain is electrically coupled to a gate of a sixty-third transistor; the sixty-third transistor, and the gate of the sixty-third transistor is electrically coupled to the drain of the sixty-first transistor, and a source is electrically coupled to the second low frequency clock signal, and a drain is electrically coupled to the third node; a sixty-fourth transistor, and a gate of the sixty-fourth transistor is electrically coupled to the first low frequency clock signal, and a source is electrically coupled to the second low frequency clock signal, and a drain is electrically coupled to the third node; a thirty-third transistor, and a gate of the thirty-third transistor is electrically coupled to the third node, and a source is electrically coupled to the charging scan signal, and a drain is electrically coupled to the direct current low voltage signal;

wherein the transfer regulation module comprises a fifty-second transistor, and a gate of the fifty-second transistor is electrically coupled to the first node, and a source is electrically coupled to the second node, and a drain is electrically coupled to the direct current low voltage signal; a sixty-second transistor, and a gate of the sixty-second transistor is electrically coupled to the first node, and a source is electrically coupled to the third node, and a drain is electrically coupled to the direct current low voltage signal; a fifty-sixth transistor, and a gate of the fifty-sixth transistor is electrically coupled to the stage transfer signal of the n−2th stage GOA unit circuit, and a source is electrically coupled to the drain of the fifty-first transistor, and a drain is electrically coupled to the direct current low voltage signal; a sixty-sixth transistor, and a gate of the sixty-sixth transistor is electrically coupled to the stage transfer signal of the n−2th stage GOA unit circuit, and a source is electrically coupled to the drain of the sixty-first transistor, and a drain is electrically coupled to the direct current low voltage signal;

wherein the rapid pull-down module comprises a thirtieth transistor, and a gate of the thirtieth transistor is electrically coupled to the stage transfer signal of the n+2th stage GOA unit circuit, and a source is electrically coupled to the charge sharing scan signal of the n−2th stage GOA unit circuit, and a drain is electrically coupled to the direct current low voltage signal; a thirty-first transistor, and a gate of the thirty-first transistor is electrically coupled to the stage transfer signal of the n+2th stage GOA unit circuit, and a source is electrically coupled to the charging scan signal, and a drain is electrically coupled to the direct current low voltage signal; a forty-first transistor, and a gate of the forty-first transistor is electrically coupled to the stage transfer signal of the n+2th stage GOA unit circuit, and a source is electrically coupled to the first node, and a drain is electrically coupled to the direct current low voltage signal;

wherein all the four high frequency clock signals are divided into a charging scan output part and a charge sharing scan output part in one period; a time width that the charging scan output part of the Mth high frequency clock signal is at high voltage level is larger than a time width that the charge sharing scan output part of the M−2th high frequency clock signal is at high voltage level;

wherein voltage levels of the first and the second frequency clock signals are reversed every other frame or multiple frames; and wherein for a first and a second stage GOA unit circuit, the gate and the source of the eleventh transistor are electrically coupled to a start signal and the drain of the twentieth transistor outputs a low voltage level.

9. The charging scan and charge sharing scan double output GOA circuit according to claim 8, wherein an output waveform of the charging scan signal is controlled by a specification of the twenty-first transistor; an output waveform of the charge sharing scan signal of the n−2th stage GOA unit circuit is controlled by a specification of the twentieth transistor.

10. The charging scan and charge sharing scan double output GOA circuit according to claim 8, wherein as the Mth high frequency clock signal is the first high frequency clock signal, the M−2th high frequency clock signal is the third high frequency clock signal; as the Mth high frequency clock signal is the second high frequency clock signal, the M−2th high frequency clock signal is the fourth high frequency clock signal.

* * * * *